United States Patent
Hiramatsu et al.

(10) Patent No.: US 6,887,316 B2
(45) Date of Patent: May 3, 2005

(54) CERAMIC HEATER

(75) Inventors: Yasuji Hiramatsu, Gifu (JP); Yasutaka Ito, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/926,730
(22) PCT Filed: Apr. 16, 2001
(86) PCT No.: PCT/JP01/03234
§ 371 (c)(1),
(2), (4) Date: Dec. 10, 2001
(87) PCT Pub. No.: WO01/80601
PCT Pub. Date: Oct. 25, 2001

(65) Prior Publication Data
US 2002/0166854 A1 Nov. 14, 2002

(30) Foreign Application Priority Data
Apr. 14, 2000 (JP) .......................... 2000-114300

(51) Int. Cl.⁷ .......................... H01L 21/00; C23C 16/00
(52) U.S. Cl. ............. 118/725; 156/345.52; 156/345.51; 219/444.1; 219/544; 219/464; 219/634; 219/638; 118/715; 361/234
(58) Field of Search ................. 118/725, 715; 156/345.52, 345.51; 219/444.1, 544, 464, 634, 638, 4; 361/234

(56) References Cited
U.S. PATENT DOCUMENTS

| | | | |
|---|---|---|---|
| 4,449,039 A | 5/1984 | Fukazawa et al. | |
| 4,733,056 A | 3/1988 | Kojima et al. | |
| 4,804,823 A | 2/1989 | Okuda et al. | |
| 5,151,871 A | 9/1992 | Matsumura et al. | |
| 5,233,166 A | 8/1993 | Maeda et al. | |
| 5,252,809 A | 10/1993 | Demin | |
| 5,331,134 A | 7/1994 | Kimura | |
| 5,566,043 A | 10/1996 | Kawada et al. | |
| 5,591,269 A * | 1/1997 | Arami et al. | 118/723 R |
| 5,643,483 A | 7/1997 | Kubota et al. | |
| 5,665,260 A * | 9/1997 | Kawada et al. | 219/467.1 |
| 5,668,524 A | 9/1997 | Aida et al. | |
| 5,766,363 A | 6/1998 | Mizuno et al. | |
| 5,904,872 A | 5/1999 | Arami et al. | |
| 6,080,970 A | 6/2000 | Yoshida et al. | |
| 6,133,557 A | 10/2000 | Kawanabe et al. | |
| 6,379,492 B2 * | 4/2002 | Bang et al. | 118/715 |

FOREIGN PATENT DOCUMENTS

| | | | | |
|---|---|---|---|---|
| JP | 57-870 | 1/1982 | | |
| JP | 58-61591 | 4/1983 | | |
| JP | 3-241380 | 10/1991 | | |
| JP | 04032184 A * | 2/1992 | | H05B/3/10 |
| JP | 4-300249 | 10/1992 | | |
| JP | 4-324276 | 11/1992 | | |

(Continued)

OTHER PUBLICATIONS

English language abstract of Japan Publication No. 08273815.
English language abstract of Japan Publication No. 08273814.
English language abstract of Japan Publication No. 06051658.

(Continued)

Primary Examiner—Gregory Mills
Assistant Examiner—Ram N Kackar
(74) Attorney, Agent, or Firm—Greenblum & Bernstein, P.L.C.

(57) ABSTRACT

A ceramic heater improving a uniformity of temperature distribution in a work heating face, wherein a resistance heating body formed on a face of a ceramic substrate opposite to the work heating face thereof is such that the scattering of thickness is within ±50% of an average thickness, and a surface roughness of the resistance heating body is a range of 0.05–100 μm as Rmax and not more than 50% of the average thickness.

5 Claims, 2 Drawing Sheets

FOREIGN PATENT DOCUMENTS

| | | | |
|---|---|---|---|
| JP | 6-51658 | 2/1994 | |
| JP | 7-263530 | 10/1995 | |
| JP | 07307377 A * | 11/1995 | ........... H01L/21/68 |
| JP | 8-273814 | 10/1996 | |
| JP | 8-273815 | 10/1996 | |
| JP | 8-306629 | 11/1996 | |
| JP | 9-172055 | 6/1997 | |
| JP | 9-213455 | 8/1997 | |
| JP | 9-306642 | 11/1997 | |
| JP | 10189696 | 7/1998 | |
| JP | 11-12053 | 1/1999 | |
| JP | 11-40330 | 2/1999 | |
| JP | 11040330 A * | 2/1999 | ........... H05B/3/20 |
| JP | 11-74064 | 3/1999 | |
| JP | 11-74336 | 3/1999 | |
| JP | 11251040 | 9/1999 | |
| JP | 11251040 A * | 9/1999 | ........... H05B/3/18 |
| WO | 00/76273 | 12/2000 | |

OTHER PUBLICATIONS

English language abstract of Japan Publication No. 04300249.
English language abstract of Japan Publication No 58–61591.
English language abstract of Japan Publication No. 57–870.
English Language Abstract of JP 4–324276.
English Language Abstract of JP 7–263530.
English Language Abstract of JP 8–306629.
English Language Abstract of JP 9–172055.
English Language Abstract of JP 9–213455.
English Language Abstract of JP 9–306642.
English Language Abstract of JP 10–189696.
English Language Abstract of JP 11–012053.
English Language Abstract of JP 11–074064.
English Language Abstract of JP 11–074336.
English Language Abstract of JP 11–40330.
English Language Abstract of JP 4–300249.
English Language Abstract of JP 11–251040.
English Language Abstract of JP 3–241380.
English Language Abstract of JP 7–263530.

* cited by examiner

CERAMIC HEATER

TECHNICAL FIELD

This invention relates to a ceramic heater mainly used in a semiconductor industry, and more particularly to a ceramic heater having an excellent uniformity of temperature distribution on a heating face of a substrate.

BACKGROUND ART

Recently, semiconductors are significantly used as an inevitable part in not only an electron industry but also various industrial fields. For example, a typical semiconductor chip is produced by slicing a silicon single crystal into a given thickness to form a silicon wafer and then forming a plurality of integrated circuits and the like on the silicon wafer.

In the production steps of the semiconductor chip, the silicon wafer placed on an electrostatic chuck is subjected to various treatments such as etching, CVD and the like to form conductor circuits or the like, or a resin for the resist is applied and dried by heating. In such treatments is frequently used a ceramic heater. For instance, ceramic heaters using a carbide or a nitride as a starting material are disclosed in JP-A-11-40330, JP-A-4-300249 and the like. However, these techniques have a problem that temperature distribution between heating elements is apt to become ununiform. In this connection, JP-A-11-251040 proposes a technique that the scattering of the thickness in the resistance heating body embedded in the inside of the substrate is made small for uniformizing the temperature distribution in the heating face of the ceramic heater. In this technique, however, since the heating body is embedded in the inside of the substrate, a distance of the heating body to the heating face of the substrate is too small, so that the technique is still insufficient in a point of ensuring the uniform temperature distribution over the whole face of the substrate.

DISCLOSURE OF THE INVENTION

The inventors have made examinations with respect to the aforementioned problem in the technique disclosed in JP-A-11-251040 and confirmed that the reason of ununiform temperature is due to the facts that the distance between the heating face of the substrate and the resistance heating body is too small, and the scattering of the thickness in the resistance heating body is large and/or the surface roughness of the resistance heating body becomes large over a certain standard and as a result the invention has been accomplished. That is, according to the invention, a resistance heating body is formed on a surface opposite to a heating face of a substrate, and the resistance heating body is housed within a particular scattering range and/or a surface roughness of the resistance heating body is adjusted to a particular surface roughness range.

The gist and construction of the invention thus developed are mentioned as follows.
1. The invention is fundamentally a ceramic heater comprising a ceramic substrate and a resistance heating body formed on a surface thereof, characterized in that a scattering of a thickness of the resistance heating body is within a range of ±50% of an average thickness.
2. And also, the invention is a ceramic heater comprising a ceramic substrate and a resistance heating body formed on a surface thereof, characterized in that a surface roughness of the resistance heating body is within a range of 0.05 $\mu$m–100 $\mu$m as Rmax and not more than 50% of an average thickness of the resistance heating body (not more than ½).
3. Furthermore, the invention is a ceramic heater comprising a ceramic substrate and a resistance heating body formed on a surface thereof, characterized in that a scattering of a thickness of the resistance heating body is within a range of ±50% of an average thickness and a surface roughness of the resistance heating body is within a range of 0.05 $\mu$m–100 $\mu$m as Rmax and not more than 50% of an average thickness of the resistance heating body (not more than ½).
4. In the invention, it is preferable that the resistance heating body is formed on the surface of the ceramic substrate opposite to the heating face thereof.
5. In the invention, it is also preferable that the ceramic substrate is made of a carbide or nitride ceramic.
6. In the invention, it is preferable that the ceramic substrate has a thickness of not more than 25 mm.
7. In the invention, it is also preferable that the ceramic substrate is provided on its surface with an insulating layer of an oxide ceramic and the resistance heating body is formed on a surface of the insulating layer.
8. In the invention, it is further preferable that the resistance heating body is constituted with two or more circuits.

The present invention also provides a ceramic heater comprising a ceramic substrate and a resistance heating body formed on a surface thereof, wherein the resistance heating body is formed on a face of the ceramic substrate opposite to a heating face thereof and a scattering of a thickness of the resistance heating body is within ±15% of an average thickness, and a surface roughness of the resistance heating body is within a range of 0.05 $\mu$m–100 $\mu$m as Rmax and not more than 10% of an average thickness of the resistance heating body.

As mentioned above, the invention is required that the resistance heating body is formed on the surface of the ceramic substrate opposite to the heating face thereof and the scattering of the thickness of the resistance heating body is made within a range of ±50% of an average thickness and/or the surface roughness of the resistance heating body is within a range of 0.05 $\mu$m–100 $\mu$m as Rmax defined in JIS R0601 and not more than 50% of the average thickness of the resistance heating body.

In the invention, the reason why the scattering of the thickness of the resistance heating body is adjusted to not more than 50% of the average thickness is due to the fact that as the scattering becomes small, the variation of the resistance value becomes small and the temperature distribution of substrate face heating a wafer or the like becomes uniform.

And also, when the surface roughness of the resistance heating body is less than 0.05 $\mu$m as Rmax, the surface is too smooth and an atmosphere gas is easily fluidized and locally gets heat of the resistance heating body and hence the temperature of the heating face for the wafer or the like becomes easily ununiform. While when the surface roughness exceeds 100 $\mu$m as Rmax, the thickness of the resistance heating body becomes scattered and the temperature of the heating face for the wafer or the like becomes ununiform. That is, when the surface roughness of the resistance heating body is too large or too small, the temperature of the heating face can not be uniformized.

In other words, the reason why the scattering and surface roughness of the thickness of the resistance heating body are adjusted is to prevent the fact that when they exceed upper limits, the scattering of the resistance value of the resistance heating body becomes large and hence the scattering of the temperature distribution of the heating face for the wafer or the like becomes large.

Moreover, in the invention, the resistance heating body is formed on the surface of the substrate in addition to the above constructions. In this way, the surface of the ceramic substrate opposite to the surface provided with the resistance heating body is rendered into the heating face, so that the diffusion and transmission of heat from the resistance heating body side to the heating face side is efficiently conducted and hence the temperature distribution near to the resistance heating body pattern is hardly caused in the heating face. It is desirable that the thickness of the ceramic substrate according to the invention is made not more than 25 mm. However, a thin substrate of not more than 25 mm is small in the heat capacity and excellent in the temperature rising property, but is apt to be strongly influenced by the scattering of the resistance value of the resistance heating body and becomes ununiform in the temperature of the heating face. In the invention, however, the scattering of the resistance value is made small by adopting the above constructions, whereby there is obtained a ceramic heater having excellent temperature rising property and uniformity of temperature in the heating face.

In JP-A-11-251040 is disclosed a technique that the heating body is embedded in the inside of the substrate to make small the scattering of the thickness of the heating body. This technique is a heater formed by embedding the resistance heating body in the inside of the substrate but is not the formation on the surface of the substrate as in the invention. And also, this technique does not mention the thickness of the substrate, which is different from the invention. Moreover, when the resistance heating body is formed in the inside of the substrate, ceramic contacts with upper and lower surfaces of the heating body and heat is reflected to the heating face for the wafer, so that the temperature scatters and becomes larger than that in the case that the heating body is formed on one-side surface of the ceramic substrate.

BEST MODE FOR CARRYING OUT THE INVENTION

Figure 1:
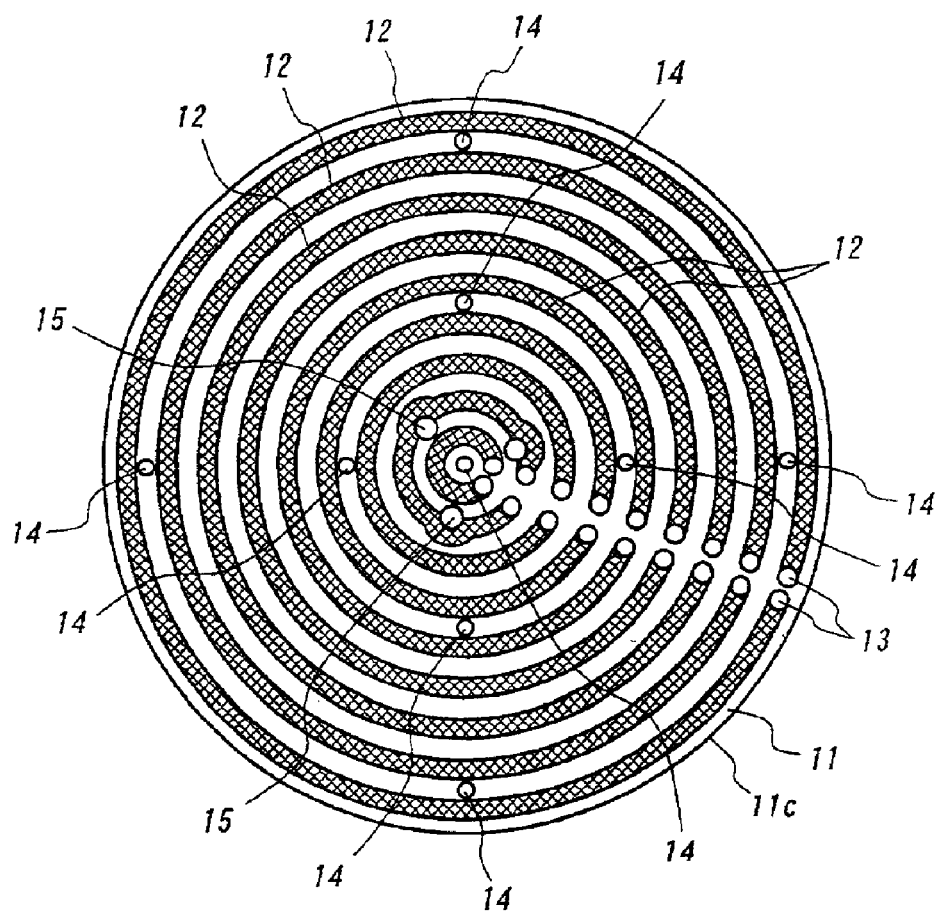
FIG. 1 is a plan view of a resistance heating body pattern in a ceramic heater according to the invention.
Figure 2:
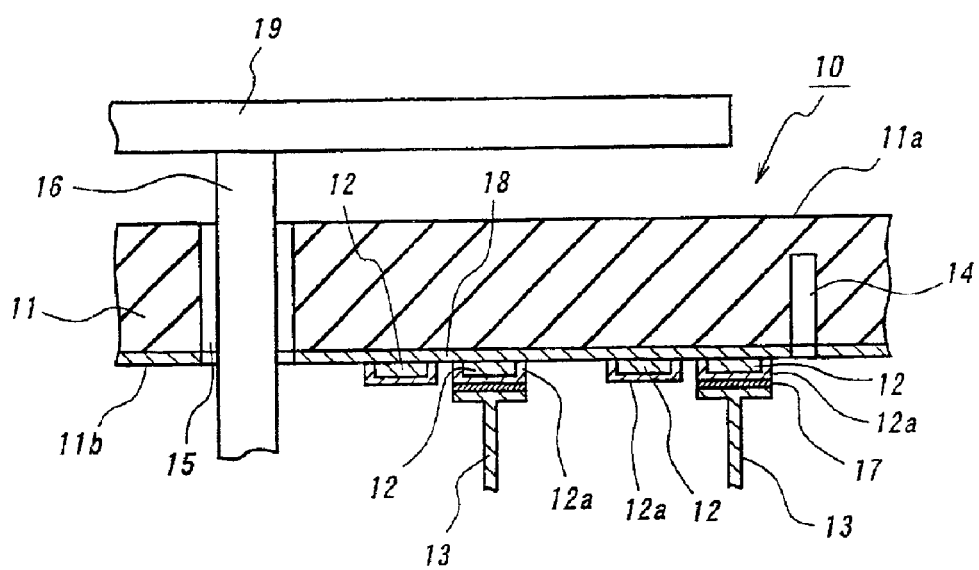
FIG. 2 is a partial section view of the ceramic heater according to the invention.

In the ceramic heater according to the invention, a nitride ceramic, a carbide ceramic or the like is used as a material for a ceramic substrate. And also, a layer of an oxide ceramic as an insulating layer is formed on the surface of the ceramic substrate, if necessary. The reason of the formation of the insulating layer is due to the fact that in case of the nitride ceramic, a volume resistance value is apt to be lowered at a high temperature by solid solution of oxygen and the like, while the carbide ceramic is electrically conductive unless it is not purified to a high level and hence when the oxide ceramic is formed as an insulating layer, the short-circuit between the circuits can be prevented at a high temperature or even if impurities are included to thereby improve a temperature controllability.

As the nitride ceramic constituting the ceramic substrate is mentioned a metal nitride ceramic such as aluminum nitride, silicon nitride, boron nitride, titanium nitride or the like. As the carbide ceramic is mentioned a metal carbide ceramic such as silicon carbide, zirconium carbide, titanium carbide, tantalum carbide, tungsten carbide or the like.

In the invention, it is desirable that a sintering aid is included in the ceramic substrate. As the sintering aid for aluminum nitride, use may be made of an alkali metal oxide, an alkaline metal oxide and a rare earth metal oxide. Among them, CaO, $Y_2O_3$, $Na_2O$, $Li_2O$ and $Rb_2O_3$ are particularly preferable. And also, alumina may be used. The content is desirable to be 0.1–20 wt %. In case of silicon carbide, the sintering aid is $B_4C$, C or AlN.

In the invention, it is desirable that the ceramic substrate contains 5–5000 ppm of carbon. The inclusion of carbon can render the ceramic substrate into a black color and hence radiant heat can sufficiently be utilized when being used as a heater. Carbon may be amorphous or crystalline. In case of using amorphous carbon, the lowering of volume resistivity at a high temperature can be prevented, while in case of using crystalline carbon, the lowering of thermal conductivity at a high temperature can be prevented. Therefore, the amorphous carbon and the crystalline carbon may be used together in accordance with the applications. And also, the carbon content is favorable to be 50–2000 ppm.

As the ceramic substrate, it is favorable to have a thickness of not more than 50 mm, particularly not more than 25 mm. Particularly, when the thickness of the ceramic substrate exceeds 25 mm, the heat capacity of the ceramic substrate becomes larger and hence when heating and cooling are carried out by a temperature control means, the temperature followability lowers due to the large heat capacity. Especially, it is favorable to be not less than 5 mm. Moreover, the thickness is desirable to exceed 1.5 mm.

As the insulating layer, the oxide ceramic is desirable. Concretely, silica, alumina, mullite, cordierite, beryllia or the like can be used. Such an insulating layer may be formed by spin-coating a sol solution of hydrolized polymerized alkoxide onto the ceramic substrate and drying and firing it, or by sputtering, CVD or the like. And also, the surface of the ceramic substrate may be subjected to an oxidation treatment to form an oxide layer.

The insulating layer is desirable to be 0.1–1000 $\mu$m. When it is less than 0.1 $\mu$m, the insulating property can not be ensured, while when it exceeds 1000 $\mu$m, the thermal conductivity from the resistance heating body to the ceramic substrate is obstructed. Further, the volume resistivity of the insulating layer is desirable to be 10 times or more the volume resistivity of the ceramic substrate (at the same measuring temperature). When it is less than 10 times, the shortcircuit of the circuit can not be prevented.

Moreover, in the ceramic heater according to the invention, the semiconductor wafer is placed on the ceramic substrate at a state of contacting with a placing face thereof. And also, the semiconductor wafer may be held at a given interval to the ceramic substrate by supporting with a support pin, a support ball or the like. The interval is desirable to be 5–5000 $\mu$m.

The semiconductor water can be received from a transporting machine, or placed on the ceramic substrate, or heated at a state of supporting the wafer by moving a lifter pin in up and down directions.

The ceramic substrate is desirable to have a diameter of not less than 200 mm. Particularly, it is desirable to be not less than 12 inches (300 mm). Such a large heater is apt to cause a problem that the temperature of the heating face becomes ununiform, but the invention is effective thereto.

In the ceramic heater according to the invention, a thermocouple may be embedded in a bottomed hole of the ceramic substrate. Because the temperature of the resistance heating body is measured by the thermocouple and the temperature can be controlled by changing voltage and current quantity based on the measured data. A size of a junction site in a metal wire of the thermocouple is equal to or more than a filament diameter of the metal wire and is favorably not more than 0.5 mm. By such a construction is made the heat capacity of the junction part small, and hence the temperature is accurately and rapidly converted into a current value. Therefore, the temperature controllability is improved and the temperature distribution of the heating face of the wafer is made small. As such a thermocouple, mention may be made of K-type, R-type, B-type, S-type, E-type, J-type, and T-type thermocouples as described in JIS C-1602 (1980). Moreover, such a thermocouple may be adhered to a bottom of the bottomed hole 14 by using a gold solder, a silver solder or the like or may be inserted into the bottomed hole 14 and sealed with a heat-resistant resin, or both cases may be used together. As the heat-resistant resin, mention may be made of thermosetting resins such as epoxy resin, polyimide resin, bismaleimide-triazine resin and the like. These resins may be used alone or in combination of two or more. As the gold solder, at least one selected from 37–80.5 wt % Au—63–19.5 wt % Cu alloys and 81.5–82.5 wt % Au—18.5–17.5 wt % Ni alloys is desirable. They have a melting temperature of not lower than 900° C. and hardly melts even at a higher temperature. As the silver solder, Ag—Cu system may be used.

As shown in FIG. 1, the resistance heating body 12 is desirable to divide into at least two circuits, more preferably 2–10 circuits. The reason on the circuit division is based on the fact that power to be charged to each circuit can be controlled to change the heat generation quantity and the temperature of the wafer-heating face 11b can be adjusted. As a pattern of the resistance heating body 12, mention may be made of helix, eccentric circle, folded line and the like in addition to concentric circle shown in FIG. 1.

In the invention, it is desirable to form the insulating layer on the surface of the ceramic substrate prior to the formation of the heating body. As a method of forming the insulating layer, a sol solution of hydrolized and polymerized alkoxide is spin-coated on the surface of the ceramic substrate and dried and fired, or the method such as sputtering, CVD or the like is conducted. And also, an oxide layer may be formed by firing the surface of the ceramic substrate in an oxidizing atmosphere as the insulating layer. In the formation of the insulating layer, it is possible to warp the ceramic substrate in one direction by shrinkage of the insulating layer.

When the resistance heating body is formed on the surface of the ceramic substrate 11, there is preferably a method wherein an electrically conductive paste containing metal particles is applied onto the surface of the ceramic substrate 11 to from a conductor paste layer of a given pattern and baked to sinter the metal particles on the surface of the ceramic substrate. Moreover, the sintering of the metal is sufficient to attain the fusion between the metal particles and between the metal particle and the ceramic.

When the resistance heating body is formed on the surface of the ceramic substrate 11, the thickness of the resistance heating body is 1–300 $\mu$m, preferably 1–100 $\mu$m, more particularly about 1–10 $\mu$m.

And also, when the heating body is formed on the surface of the ceramic substrate, the width of the heating body is preferably 1–50 mm.

In the heating body, the resistance value can be changed in accordance with the width and the thickness, but the above ranges are most practical. The resistance value becomes large as the thickness is thin and the width is narrow.

By setting the forming position of the heating body as mentioned above, heat generated from the heating body diffuses into the whole of the ceramic substrate during the transmission to uniformize the temperature distribution of the face heating the object to be heated (silicon wafer) and hence the temperature of each portion of the object (work) to be heated such as wafer or the like is uniformized.

The resistance heating body may be rectangular or ellipsoidal at section but is desirable to be flat. When it is flat, heat is easy to be dissipated toward the heating face of the wafer and ununiform temperature distribution is not formed in the heating face of the wafer. The section of the resistance heating body is desirable to have an aspect ratio (width of heating body/thickness of heating body) of about 10–5000. The reason why the aspect ratio of the section is adjusted to the above range is based on the fact that when it is within the above range, the resistance value of the heating body can be increased and also the uniformity of the temperature in the heating face of the wafer can be ensured. Particularly, when the thickness of the resistance heating body 12 is made constant, if the aspect ratio is smaller than the above range, the transmission quantity (diffusion) of heat toward the face of the substrate 11 heating the wafer becomes small and hence heat distribution near to the pattern of the resistance heating body is generated in the face heating the wafer. Inversely, if the aspect ratio is too large, a portion just above a center of the resistance heating body becomes high temperature and finally heat distribution near to the pattern of the heating body is generated in the face heating wafer. Therefore, the aspect ratio at the section of the heating body is favorable to be 10–5000 considering the temperature distribution. When the resistance heating body is formed on the surface of the substrate 11, the aspect ratio is desirable to be 10–200.

In order to form the resistance heating body on the surface of the ceramic substrate, a conductive paste is used. The conductive paste is not particularly restricted, but in order to ensure the electrically conductivity, it is favorable to contain metal particles or electrically conductive ceramic but also a resin, a solvent, a tackifier and the like. As the metal particle, noble metal (gold, silver, platinum, palladium) is preferable and it is desirable to use two or more together. These metals are not relatively oxidized and have a resistance value enough to generate heat. The metal particle or electrically conductive ceramic particle (oxide particles or the like) is favorable to have a particle size of about 0.1–100 $\mu$m. When the particle size is less than 0.1 $\mu$m, the particles are too fine and are easily oxidized, while when it exceeds 100 $\mu$m, the particles are hardly sintered and the resistance value becomes large. The form of the metal particle may be spherical or scaly. When using these metal particles, a mixture of spherical particle and scaly particle may be used. When the metal particles are spherical or a mixture of spherical and scaly particles, the thickness scattering or surface roughness can be made small.

As the resin used in the conductive paste, mention may be made of epoxy resin, phenolic resin and so on. As the solvent, isopropyl alcohol or the like may be mentioned. As the tackifier, cellulose or the like may be mentioned. As the conductive paste, it is desirable to use a sintered body of metal particles and oxide as mentioned above. By sintering the oxide together with the metal particles can be adhered the metal particles to the nitride ceramic or carbide ceramic as the ceramic substrate 11. Although the reason why the adhesion property to the nitride ceramic or carbide ceramic is improved by incorporating the oxide into the conductive paste is not clear, it is considered that the surface of the metal particle and the surface of the nitride ceramic or carbide ceramic are slightly oxidized to form oxide films and these oxide films are integrally sintered through the oxide to adhere the metal particles to the nitride ceramic or carbide ceramic.

As the oxide, at least one selected from the group consisting of lead oxide, zinc oxide, silica, boron oxide ($B_2O_3$), alumina, yttria, titania and ruthenium oxide is favorable. These oxides can improve the adhesion property between the metal particle and the nitride ceramic or carbide ceramic without increasing the resistance value of the heating body. It is desirable that when the total amount of these metal oxides is 100 parts by weight, the lead oxide, zinc oxide, silica, boron oxide ($B_2O_3$), alumina, yttria, titania and ruthenium oxide are adjusted to lead oxide: 1–10 wt %, silica: 1–30 wt %, boron oxide: 5–50 wt %, zinc oxide: 20–70 wt %, alumina: 1–10 wt %, yttria: 1–50 wt %, titania: 1–50 wt % and ruthenium oxide: 1–50 wt %, respectively, provided that the total of these oxides does not exceed 100 parts by weight. Particularly, the adhesion property to the nitride ceramic can be improved by adjusting the amounts of these oxides within the above ranges.

The amount of the oxide added to the metal particle is favorable to be not less than 0.1 wt % but less than 10 wt %. And also, a surface resistivity when the resistance heating body is formed by using the conductive paste of the above structure is favorable to be about 0.1–10 Ω/□. When the surface resistivity exceeds 10 Ω/□, the width of the heating body pattern should be made large for the control of the resistance value and hence if the heating body pattern is divided into two or more circuits, the degree of freedom in the design of the pattern is lost and the uniformity of the temperature can not be ensured. And also, when the surface resistivity is less than 0.1 Ω/□, the resistance value can not be ensured unless the pattern width should be made small and hence there is caused a problem that the temperature of the heating face becomes ununiform as mentioned above.

When the resistance heating body 12 is formed on the surface of the ceramic substrate 11, it is desirable to form a metal covering layer 12a such as a solder or the like on the surface of the resistance heating body. When the metal used in the formation of the metal covering layer is a non-oxidizing metal, it is not particularly restricted. Concretely, it includes, for example, gold, silver, palladium, platinum, nickel and the like. They may be used alone or in a combination of two or more. Among them, nickel is preferable because nickel is effective for preventing heat diffusion of a solder. In the resistance heating body 12 is required a terminal for connecting to a power source. The terminal is attached to the resistance heating body through a solder. As such a connection terminal is mentioned a terminal pin 13 made of Kovar.

For the connection of the connecting terminal, alloys of silver-lead, lead-tin, bismuth-tin and the like may be used as a solder. Moreover, the thickness of the solder layer is favorable to be 0.1–50 μm, which is sufficient for ensuring the connection through the solder.

The production method of the ceramic heater according to the invention is described below.

(1) Step of Preparing Ceramic Substrate

A slurry of powder of the aforementioned nitride ceramic or carbide ceramic is prepared by compounding a sintering aid such as yttria or the like, a binder and the like, if necessary. Thereafter, the slurry is granulated by a method such as spray drying or the like and the resulting granulates are placed in a mold and shaped into a plate by pressurization to form a green shaped body (green), and a portion being a through-hole 15 for inserting a lifter pin 16 and a portion being a bottomed hole 14 for embedding a temperature measuring element such as a thermocouple or the like are formed therein.

Then, the green shaped body is heated and fired and sintered to produce a ceramic plate-shaped body. Thereafter, a ceramic substrate 11 is prepared by working into a given form, but it may be shaped as it is after the firing. And also, it is possible to produce a ceramic substrate 11 having no pore by heating and firing under pressurization. The heating and firing may be conducted at a temperature higher than a sintering temperature, and is 1000–2500° C. in case of the nitride ceramic or carbide ceramic.

(2) Step of Printing a Conductive Paste for Resistance Heating Body onto a Surface of a Substrate A conductive paste is a fluidizable material comprising metal particles of two or more noble metals, a resin and a solvent and having a high viscosity. The conductive paste is printed onto a portion forming a resistance heating body by using a screen printing or the like to form a conductive paste layer. Since the resistance heating body 12 is required to render the whole of the ceramic substrate 11 into a uniform temperature distribution, it is desirable to print a pattern of concentric circles as shown in FIG. 1. The printing may be carried out 2 times or more by changing the printing direction into right angle so as to make thickness scattering and surface roughness small. And also, a scaly paste may be used as the conductive paste.

It is desirable that the conductive paste layer is formed so that a section of a heating body 13 after the firing is a rectangular and flat form.

(3) Firing of Conductive Paste

The conductive paste layer printed on a face (bottom face) of the ceramic substrate 11 opposite to a heating face thereof is heated and fired to remove the resin and the solvent, and the metal particles in the paste are sintered and baked onto the bottom face of the substrate 11 to form a resistance heating body 12. The heating and firing temperature is favorable to be 500–1000° C.

When the above metal particles are added to the conductive paste, the metal particles, substrate and metal oxide are integrally united by sintering, so that the adhesion property between the resistance heating body 12 and the ceramic substrate 11 is improved.

For example, at a state of printing the resistance heating body as it is, the thickness scattering exceeds 50% of an average value, and the surface roughness exceeds 100 μm as Rmax. For this end, there is required a method of adjusting the thickness scattering and surface roughness Rmax. As the adjusting method of thickness scattering and surface roughness, there can be adopted a method of removing a thicker portion by laser trimming, a method of polishing a surface by a belt sander or buff polishing, a method of removing irregularity of the heating body by using a scaly paste, and the like.

(4) Formation of Cover Layer

It is desirable to form a metal cover layer 12a on the surface of the resistance heating body 12. The metal cover layer 12a may be formed by electrolytic plating, electroless plating, sputtering or the like, but the electroless plating is favorable considering the productivity. As the metal cover layer, a resin such as polyimide or an inorganic substance such as glass or the like may be adopted in addition to the metal.

(5) Attachment of Terminal or the Like

An outer terminal (terminal pin 13) for connecting to a power source is attached to an end portion of the pattern of the heating body 12 with a solder. And also, a thermocouple not shown is fixed to the bottomed hole 14 through silver solder, gold solder, resin, ceramic or the like and sealed with a heat-resistant resin such as polyimide or the like to complete the production of a ceramic heater 10.

Moreover, the ceramic heater according to the invention may be rendered into an antistatic chuck by arranging an antistatic electrode, or into a wafer prover by arranging a chuck top conductor layer.

EXAMPLE

Example 1

Production of Silicon Carbide Ceramic Heater (1) Granulated powder is prepared by spray-drying a composition comprising 100 parts by weight of SiC powder (average particle size: 0.3 $\mu$m), 0.5 part by weight of $B_4C$ as a sintering aid, 12 parts by weight of acrylic binder and an alcohol.
(2) Then, the granulated powder is placed in a mold and shaped into a flat plate to form a green shaped body (green).
(3) The worked green shaped body is hot-pressed at 2100° C. under a pressure of 180 kg/cm² to form a SiC plate-shaped body having a thickness of 3 mm, and a disc body having a diameter of 210 mm. cut out from the surface of the plate-shaped body to form a ceramic substrate 11. Onto a face of the ceramic substrate 11 forming a heating body (opposite to a heating face) is applied a glass paste (made by Shoei Kagaku Kogyo Co., Ltd. G-5232N) and fired at 1000° C. for 1 hour to form an insulating layer 11b of $SiO_2$ film having a thickness of 2 $\mu$m.

The ceramic substrate 11 is subjected to a drilling, whereby a portion being a through-hole 15 for the insertion of a lifter pin 16 supporting a an upward and downward movement of silicon wafer and a portion being a bottomed hole 14 for embedding a thermocouple (diameter: 1.1 mm, depth: 2 mm) are formed.
(4) Onto a heating body forming face of the ceramic substrate obtained in the above (3) is printed a conductive paste for the heating body by screen printing. The printed pattern is a concentric circle pattern as shown in FIG. 1. This pattern is divided into nine pattern segments, whereby temperature control can be conducted by a control section of first to third segments, a control section of fourth to sixth segments and a control section of seventh to ninth segments.

As the conductive paste is used the following composition. This comprises 90 parts by weight of scaly silver (made by Shoei Kagaku Kogyo Co., Ltd. Ag-540), 10 parts by weight of needle-crystal platinum (Shoei Kagaku Kogyo Co., Ltd. Pt-401), 7.5 parts by weight of silica, 1.5 parts by weight of boron oxide, 6 parts by weight of zinc oxide and 30 parts by weight of cellulose acetate as an organic vehicle.
(5) Then, the ceramic substrate 11 printed with the conductive paste is heated and fired at 780° C. to sinter silver and platinum in the conductive paste and bake onto the substrate 11 to form a resistance heating body 12. The heating body 12 has a thickness of 5 $\mu$m, a width of 10 mm and an area resistivity of 0.13 Ω/□.
(6) The ceramic substrate 11 prepared in the above (5) is immersed in an electroless nickel plating bath of an aqueous solution containing 80 g/l of nickel sulfate, 24 g/l of sodium hypophosphite, 12 g/l of sodium acetate, 8 g/l of boric acid and 6 g/l of ammonium chloride to precipitate a metal cover layer (nickel layer) 12a of 1 $\mu$m in thickness on the surface of the resistance heating body 12 made of silver-lead.
(7) A silver-lead solder paste (made by Tanaka Kikinzoku Co., Ltd.) is printed on a terminal-attaching portion for ensuring the connection to power source by screen printing to form a solder layer 17. Then, an outer terminal pin 13 made of Kovar is placed on the solder layer 17 on the surface of the heating body 12 and reflowed by heating at 420° C. to attach the terminal pin 13.
(8) A thermocouple for the temperature control is fitted into the bottomed hole 14 and embedded and fixed in a ceramic adhesive (made by Toa Gosei Co., Ltd. Aronceramic) to obtain a ceramic heater 10.

Example 2

Production of Silicon Carbide Ceramic Heater

A silicon carbide ceramic heater is produced in the same manner as in Example 1 except that SiC having an average particle size of 1.0 $\mu$m is used, and the sintering temperature is 1900° C., and the resulting plate-shaped body is fired at 1500° C. for 2 hours, and an insulating layer 11b of $SiO_2$ having a thickness of 1 $\mu$m is formed on the surface of the plate-shaped body.

Example 3

Production of Aluminum Nitride Ceramic Heater (1) Granulated powder is prepared by spray drying a composition comprising 100 parts by weight of aluminum nitride powder (average particle size: 0.6 $\mu$m), 4 parts by weight of yttria (average particle size: 0.4 $\mu$m), 12 parts by weight of an acrylic binder and an alcohol.
(2) Then, the granulated powder is placed in a mold and shaped into a flat form to obtain a green shaped body (green).
(3) The thus formed green shaped body is hot-pressed at 1800° C. under a pressure of 200 kg/cm² to obtain a AlN plate-shaped body having a thickness of 3 mm. Then, a disc having a diameter of 210 mm is cut out from the plate-shaped body as a ceramic substrate 11. The same glass paste as in Example 1 is applied onto the surface of the ceramic substrate 11 and dried and fired to form an insulating layer 11b of $SiO_2$ having a thickness of 2 $\mu$m. This shaped body is drilled to form a portion as a through-hole 15 for inserting a lifter pin 16 for a silicon wafer and a portion as a bottomed hole 14 for embedding a thermocouple (diameter: 1.1 mm, depth: 2 mm).
(4) A conductive paste is printed on the ceramic substrate 11 obtained in the above (3) by screen printing. The printed pattern is a concentric circle pattern as shown in FIG. 1. This pattern is divided into nine pattern segments, whereby temperature control can be conducted by a control section of first to third segments, a control section of fourth to sixth segments and a control section of seventh to ninth segments.

As the conductive paste is used a composition comprising 50 parts by weight of scaly silver (made by Shoei Kagaku Kogyo Co., Ltd. Ag-540), 50 parts by weight of spherical palladium (made by Shoei Kagaku Kogyo Co., Ltd. Pd-225), 10 wt % of zinc oxide, 8 wt % of silica, 2 wt % of boron oxide and 30 parts by weight of cellulose acetate as an organic vehicle.

(5) Then, the ceramic substrate 11 printed with the conductive paste is heated and fired at 780° C. to sinter silver and Pd in the conductive paste and bake onto the surface of the substrate to form a resistance heating body 12. The silver-Pd resistance heating body 12 has a thickness of 5 μm, a width of 15 mm and an area resistivity of 5.09 Ω/□.

(6) The ceramic substrate 11 prepared in the above (5) is immersed in an electroless nickel plating bath of an aqueous solution containing 80 g/l of nickel sulfate, 24 g/l of sodium hypophosphite, 12 g/l of sodium acetate, 8 g/l of boric acid and 6 g/l of ammonium chloride to precipitate a metal cover layer (nickel layer) 12a of 1 μm in thickness on the surface of the silver-lead resistance heating body 12.

(7) A silver-lead solder paste (made by Tanaka Kikinzoku Co., Ltd.) is printed on a terminal-attaching portion for ensuring the connection to power source by screen printing to form a solder layer 17. Then, an outer terminal pin 13 made of Kovar is placed on the solder layer 17 and reflowed by heating at 420° C. to attach the terminal pin 13 to the surface of the resistance heating body 12.

(8) A thermocouple for the temperature control is fitted into the bottomed hole 14 and embedded and fixed in a ceramic adhesive (made by Toa Gosei Co., Ltd. Aronceramic) to obtain a ceramic heater 10.

Example 4

The same procedure as in Example 3 is repeated except that a composition comprising 50 parts by weight of spherical platinum (made by Shoei Kagaku Kogyo Co., Ltd. Pt-225), 10 wt % of zinc oxide, 8 wt % of silica, 2 wt % of boron oxide and 30 parts by weight of cellulose acetate as an organic vehicle is used as a conductive paste and a printed thickness is 200 μm and the surface is buff-polished by 50 μm.

Example 5

The same procedure as in Example 1 is repeated except that the surface of the resistance heating body is polished with diamond paste (made by Maruto Co., Ltd. average particle size: 1 μm).

Comparative Example 1

The same procedure as in Example 1 is repeated except that Solvest PS603D made by Tokuriki Kagaku Kenkyusho used in the formation of through-holes in a printed wiring board is used as a conductive paste. This conductive paste is a silver paste and contains 7.5 parts by weight of metal oxides consisting of lead oxide (5 wt %), zinc oxide (55 wt %), silica (10 wt %), boron oxide (25 wt %) and alumina (5 wt %) based on 100 parts by weight of silver. The pattern is formed by nine pattern segments and a pattern line width is 1 mm.

Comparative Example 2

The same procedure as in Example 4 is repeated except that the surface is not buff-polished.

Comparative Example 3

The same procedure as in Example 1 is repeated except that the surface of the resistance heating body is polished with diamond paste (made by Maruto Co., Ltd. average particle size: 0.25 μm).

Comparative Example 4

(1) A paste comprising 100 parts by weight of aluminum nitride powder fired at 500° C. in air for 1 hour (made by Tokuyama Co., Ltd. average particle size: 1.1 μm), 1,2,4 parts by weight of yttria (average particle size: 0.4 μm), 11.5 parts by weight of an acrylic binder, 0.5 part by weight of a dispersing agent and 53 parts by weight of a mixed alcohol of 1-butanol and ethanol is shaped by a doctor blade process to obtain a green sheet having a thickness of 0.47 mm.

(2) Then, the green sheet is dried at 80° C. for 5 hours and punched to form a portion for through-hole inserting a semiconductor wafer supporting pin (lifter pin) and portions for through-holes (pads) connecting to elongated conductors having diameters of 1.8 mm, 3.0 mm and 5.0 mm.

(3) A conductive paste A is prepared by mixing 100 parts by weight of tungsten carbide particles having an average particle size of 1 μm, 3.0 parts by weight of an acrylic binder, 3.5 parts by weight of α-terpineol solvent and 0.3 parts by weight of a dispersing agent.

(4) Further, the conductive paste is filled in the holes for through-holes (pads) 4 connecting external terminals.

The green sheet printed with the pattern of the resistance heating body is laminated on its upper side (heating face) with 34–60 green sheets not printed with the conductive paste and on its lower side with 13–30 no-printed green sheets and pressed at 130° C. under a pressure of 80 kg/cm$^2$ to form a laminate.

(5) The thus obtained laminate is degreased in a nitrogen gas at 600° C. for 5 hours and hot-pressed at 1890° C. under a pressure of 150 kg/cm$^2$ for 3 hours to form a plate-shaped body 1 of aluminum nitride. The thickness of the resistance heating body is 15 M.

With respect to the heaters of Examples 1–3 and Comparative Examples 1, 2 is measured a difference between highest temperature and lowest temperature of a heating face by raising temperature to 400° C. with a thermoviewer (made by Nippon Datum Co., Ltd. IR-16-2012-0012). And also, the surface roughness and scattering of thickness are measured with a surface profile measuring device (KLA. Tencor Corp. P-11). The measuring conditions are scanning rate of 50 μm/sec., load of 3 mg, sampling rate of 100 Hz and wavelength filter of 80 μm. The scattering of thickness is represented by percentage after the thickness is measured at arbitrary 20 points and the measured values are averaged and a value apart from the average is selected from the measured values and divided by the average value.

Comparative Example 5

The same procedure as in Example 1 is repeated except that the thickness of the ceramic substrate is 23 mm.

Comparative Example 6

The same procedure as in Example 1 is repeated except that the thickness of the ceramic substrate is 28 mm.

Moreover, when the heating body is polished as in Examples 4, 5 and Comparative Example 3, Rmax itself indicates the scattering of thickness, but Rmax is not coincident with the scattering of thickness in the cases other than the above. The scattering is reflected by undulation of the resistance heating body, but when the undulation is removed by polishing, the surface roughness is coincident with the scattering.

TABLE 1

| | Average thickness (μm) | Measured thickness (μm) max | Measured thickness (μm) min | Scattering (%) | Rmax (μm) | Temperature (° C.) |
|---|---|---|---|---|---|---|
| Example 1 | 5 | 5.37 | 4.62 | 15 | 0.5 | 5 |
| Example 2 | 5 | 5.13 | 4.88 | 5 | 0.5 | 3 |
| Example 3 | 5 | 5.75 | 4.25 | 30 | 1 | 6 |
| Example 4 | 200 | 240 | 160 | 40 | 80 | 6 |
| Example 5 | 4.5 | 4.53 | 4.47 | 1.3 | 0.06 | 2 |
| Comparative Example 1 | 5 | 6.38 | 3.62 | 55 | 3.5 | 10 |
| Comparative Example 2 | 200 | 265 | 135 | 65 | 130 | 15 |
| Comparative Example 3 | 5 | 5.02 | 4.98 | 0.8 | 0.04 | 10 |
| Comparative Example 4 | 15 | 15.7 | 14.3 | 9 | — | 13 |
| Comparative Example 5 | 5 | 6.39 | 3.63 | 55 | 3.6 | 10 |
| Comparative Example 6 | 5 | 6.37 | 3.61 | 55 | 3.5 | 6 |

① As shown in Table 1, Example 1 of the invention shows that the scattering of thickness is 15% to the average thickness, the surface roughness is 0.5 μm as Rmax and the temperature difference is 5° C., Example 2 shows that the scattering of thickness is 5% to the average thickness, the surface roughness is 0.5 μm as Rmax and the temperature difference is 3° C., and Example 3 shows that the scattering of thickness is 30% to the average thickness, the surface roughness is 1 μm as Rmax and the temperature difference is 6° C.

On the contrary, Comparative Example 1 shows that the scattering of thickness is 55% to the average thickness, the surface roughness is 3.5 μm as Rmax and the temperature difference is 10° C.

② In Examples 4 and 5, the surface roughness is adjusted by polishing. Example 4 shows that the scattering of thickness is 40% to the average thickness, the surface roughness is 80 μm as Rmax and the temperature difference is 6° C., and Example 5 shows that the scattering of thickness is 1.3% to the average thickness, the surface roughness is 0.06 μm as Rmax and the temperature difference is 2° C.

③ Comparative Example 2 is a case that Rmax exceeds 100 μm. In this case, the scattering of thickness becomes too large and hence the resistance value is scattered and the temperature difference of the heating face becomes large. Further, in Comparative Example 3, the surface roughness is inversely made small, but there is caused a surprising result that the temperature scattering of the heating face becomes rather large. This is guessed due to the fact that air contacting with the resistance heating body is very easily fluidized to catch heat and hence the resistance heating body is locally cooled. In Comparative Example 4, the resistance heating body is embedded in the inside of the ceramic substrate. At this state, even when the scattering of thickness is made small, since ceramic contacts with the upper and lower faces of the resistance heating body, it is thought that the temperature of the heating face is hardly uniformized by the reflection of heat.

In Comparative Examples 5 and 6, as the thickness of the ceramic substrate exceeds 25 mm, the scattering of the temperature in the heating face becomes small. This is considered due to the fact that when the substrate becomes thick, the transmitting distance of heat becomes long and heat is diffused.

Meanwhile, the time raising the temperature of the heating face after the application of power is 0.5 (sec) in Examples 1–5, 0.5 (sec) in Comparative Example 1, 1.0 (sec) in Comparative Example 5 and 60 (sec) in Comparative Example 6. As the ceramic substrate becomes thick, the temperature followability is poor.

As seen from the above, according to the ceramic heater of the invention, the temperature distribution of the heating face can be uniformized.

INDUSTRIAL APPLICABILITY

The ceramic heater according to the invention is used in apparatuses for producing semiconductors and checking the semiconductor. As a concrete apparatus, mention may be made of an electrostatic chuck, a wafer prover, a scepter and the like. In case of using the electrostatic chuck, an electrostatic electrode and RF electrode are formed in addition to the resistance heating body, while in case of using the wafer prover, a chucktop conductor layer as a conductive body is formed on the surface and a guard electrode and a ground electrode are formed in the inside as a conductive layer. And also, the ceramic substrate for the semiconductor device according to the invention is optimum to be used above 100° C., desirably above 200° C.

We claim:

1. A ceramic heater comprising a ceramic substrate and a resistance heating body formed on a surface thereof, wherein the resistance heating body is formed on a face of the ceramic substrate opposite to a heating face thereof and a scattering of a thickness of the resistance heating body is within ±15% of an average thickness, and a surface roughness of the resistance heating body is within a range of 0.05 μm–100 μm as Rmax and not more than 10% of an average thickness of the resistance heating body.

2. A ceramic heater according to claim 1, wherein the ceramic substrate is a carbide or nitride ceramic.

3. A ceramic heater according to claim 1, wherein the ceramic substrate has a thickness of not more than 25 mm.

4. A ceramic heater according to claim 1, wherein an insulating layer of an oxide ceramic is formed on the surface of the ceramic substrate and the resistance heating body is formed on a surface of the insulating layer.

5. A ceramic heater according to claim 1, wherein the resistance heating body is constructed by two or more circuits.

* * * * *